(12) United States Patent
Park et al.

(10) Patent No.: US 8,253,141 B2
(45) Date of Patent: Aug. 28, 2012

(54) THIN FILM TRANSISTOR, METHOD OF FABRICATING THE SAME, AND ORGANIC LIGHT EMITTING DIODE DISPLAY DEVICE INCLUDING THE THIN FILM TRANSISTOR

(75) Inventors: Byoung-Keon Park, Yongin (KR); Jin-Wook Seo, Yongin (KR); Tae-Hoon Yang, Yongin (KR); Kil-Won Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/502,413

(22) Filed: Jul. 14, 2009

(65) Prior Publication Data

US 2010/0006855 A1  Jan. 14, 2010

(30) Foreign Application Priority Data

Jul. 14, 2008 (KR) .......................... 10-2008-0068314

(51) Int. Cl.
*H01L 29/76* (2006.01)
*H01L 29/04* (2006.01)
*H01L 27/01* (2006.01)
*H01L 31/036* (2006.01)
*H01L 31/0376* (2006.01)

(52) U.S. Cl. ............... 257/66; 257/59; 257/72; 257/347
(58) Field of Classification Search .................... 257/66, 257/57, 59, 72, 347, 350, 351, 223, 227, 257/291, 292, 439, 443, 655
See application file for complete search history.

(56) References Cited

U.S. PATENT DOCUMENTS

| | | | |
|---|---|---|---|
| 3,465,209 A | 9/1969 | Denning et al. |
| 5,637,515 A | 6/1997 | Takemura |
| 6,087,206 A | 7/2000 | Hamada |
| 6,191,449 B1 | 2/2001 | Shino |
| 6,380,007 B1 | 4/2002 | Koyama |
| 6,399,460 B1 | 6/2002 | Yamaguchi et al. |

(Continued)

FOREIGN PATENT DOCUMENTS

CN 1388591 A 1/2003

(Continued)

OTHER PUBLICATIONS

European Search Report issued Nov. 3, 2009 in corresponding European Patent Application No. 09165373.3.

(Continued)

*Primary Examiner* — Chuong A. Luu
(74) *Attorney, Agent, or Firm* — H.C. Park & Associates, PLC

(57) ABSTRACT

A thin film transistor (TFT), a method of fabricating the same, and an organic light emitting diode (OLED) display device having the TFT. The TFT includes: a substrate; a polycrystalline silicon (poly-Si) semiconductor layer disposed on the substrate, including source, drain, and channel regions, a crystallization-inducing metal, first gettering sites disposed on opposing edges of the semiconductor layer, and a second gettering site spaced apart from the first gettering sites; a gate insulating layer disposed on the semiconductor layer; a gate electrode disposed on the gate insulating layer; an interlayer insulating layer disposed on the gate electrode; and source and drain electrodes disposed on the interlayer insulating layer and electrically connected to the source and drain regions of the semiconductor layer.

22 Claims, 13 Drawing Sheets

U.S. PATENT DOCUMENTS

| | | | |
|---|---|---|---|
| 6,495,857 | B2 | 12/2002 | Yamazaki |
| 6,500,704 | B1 | 12/2002 | Hirano et al. |
| 6,506,669 | B1 | 1/2003 | Kuramasu et al. |
| 6,531,815 | B1 | 3/2003 | Okuyama et al. |
| 6,620,661 | B2 | 9/2003 | Maekawa et al. |
| 6,746,905 | B1 | 6/2004 | Fukuda |
| 6,893,503 | B1 | 5/2005 | Ohnuma et al. |
| 7,045,444 | B2 | 5/2006 | Yamazaki et al. |
| 7,098,089 | B2 | 8/2006 | Paik |
| 7,130,002 | B2 | 10/2006 | Seo et al. |
| 7,202,143 | B1* | 4/2007 | Naseem et al. ............ 438/486 |
| 2001/0025992 | A1 | 10/2001 | Nakajima et al. |
| 2001/0041397 | A1 | 11/2001 | Fukushima |
| 2002/0013114 | A1 | 1/2002 | Ohtani |
| 2002/0016029 | A1 | 2/2002 | Kawakita et al. |
| 2002/0096681 | A1* | 7/2002 | Yamazaki et al. ............ 257/66 |
| 2002/0182828 | A1 | 12/2002 | Asami et al. |
| 2003/0013279 | A1 | 1/2003 | Jang et al. |
| 2003/0030108 | A1 | 2/2003 | Morosawa |
| 2003/0148561 | A1 | 8/2003 | Nakajima |
| 2003/0155572 | A1 | 8/2003 | Han et al. |
| 2003/0201442 | A1 | 10/2003 | Makita |
| 2004/0046171 | A1 | 3/2004 | Lee et al. |
| 2004/0089878 | A1 | 5/2004 | Takehashi et al. |
| 2004/0135180 | A1 | 7/2004 | Makita |
| 2004/0164300 | A1 | 8/2004 | Yamazaki et al. |
| 2004/0206958 | A1 | 10/2004 | Yamazaki et al. |
| 2005/0035352 | A1 | 2/2005 | Onizuka |
| 2005/0105037 | A1* | 5/2005 | Kim et al. ............ 349/151 |
| 2005/0110022 | A1 | 5/2005 | Kim et al. |
| 2005/0133867 | A1 | 6/2005 | Ohtani et al. |
| 2005/0140841 | A1 | 6/2005 | Yang et al. |
| 2005/0170573 | A1 | 8/2005 | Makita et al. |
| 2005/0285111 | A1 | 12/2005 | Tsuboi |
| 2006/0033107 | A1 | 2/2006 | Lee et al. |
| 2006/0040438 | A1 | 2/2006 | Lu et al. |
| 2006/0115948 | A1 | 6/2006 | Tokunaga |
| 2006/0263957 | A1* | 11/2006 | Wong et al. ............ 438/166 |
| 2007/0007529 | A1 | 1/2007 | Takemura et al. |
| 2007/0181890 | A1 | 8/2007 | Yamazaki et al. |
| 2007/0207577 | A1 | 9/2007 | Oyu |
| 2007/0228420 | A1 | 10/2007 | Takano et al. |
| 2008/0001228 | A1 | 1/2008 | Shionoiri et al. |
| 2008/0217620 | A1 | 9/2008 | Park et al. |
| 2008/0246027 | A1 | 10/2008 | Kim |
| 2009/0008642 | A1 | 1/2009 | Kim et al. |

FOREIGN PATENT DOCUMENTS

| | | |
|---|---|---|
| CN | 1638147 | 7/2005 |
| EP | 0 225 821 | 6/1987 |
| EP | 0 816 903 A1 | 1/1998 |
| EP | 1 052 700 | 11/2000 |
| EP | 1 508 921 A2 | 2/2005 |
| EP | 1 524 702 A2 | 4/2005 |
| EP | 1 858 068 | 11/2007 |
| EP | 2 003 695 | 12/2008 |
| EP | 2 009 680 | 12/2008 |
| EP | 2003695 | 12/2008 |
| EP | 2 028 687 | 2/2009 |
| EP | 2 107 613 | 10/2009 |
| JP | 05-047791 | 2/1993 |
| JP | 07-176753 | 7/1995 |
| JP | 07-326764 | 12/1995 |
| JP | 10-012882 | 1/1998 |
| JP | 10-223533 | 8/1998 |
| JP | 11-111992 | 4/1999 |
| JP | 2000-036598 | 2/2000 |
| JP | 2000-114527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-075870 | 3/2003 |
| JP | 2003-100633 | 4/2003 |
| JP | 2003-188098 | 7/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-181973 | 7/2005 |
| JP | 2005-197526 | 7/2005 |
| JP | 2006-49823 | 2/2006 |
| JP | 2006-345003 | 12/2006 |
| KR | 1999-75412 | 10/1999 |
| KR | 1999-88504 | 12/1999 |
| KR | 2000-52006 | 8/2000 |
| KR | 2003-3043 | 1/2003 |
| KR | 2003-57656 | 7/2003 |
| KR | 2003-69779 | 8/2003 |
| KR | 2003-73075 | 9/2003 |
| KR | 2003-73076 | 9/2003 |
| KR | 2003-84738 | 11/2003 |
| KR | 2004-82168 | 9/2004 |
| KR | 10-482462 | 4/2005 |
| KR | 2005-36625 | 4/2005 |
| KR | 10-2005-0049684 | 5/2005 |
| KR | 10-2005-0049692 | 5/2005 |
| KR | 2005-41836 | 5/2005 |
| KR | 10-509529 | 8/2005 |
| KR | 2005-106244 | 11/2005 |
| KR | 2006-99694 | 9/2006 |
| KR | 10-2007-0024016 | 3/2007 |
| KR | 2008-0082827 | 9/2008 |

OTHER PUBLICATIONS

Final Office Action of U.S. Appl. No. 12/194,739 issued on Jun. 9, 2011.

U.S. Office Action dated Mar. 8, 2010, issued in U.S. Appl. No. 12/194,739.

Jones, et al., "Diffusivity of impurities in polysilicon", Feb. 21, 2007, XP009150765.

US Office Action dated Nov. 26, 2010, issued in corresponding U.S. Appl. No. 12/130,340.

US Office Action dated Dec. 9, 2010, issued in corresponding U.S. Appl. No. 12/194,730.

US Office Action dated Dec. 23, 2010, issued in corresponding U.S. Appl. No. 12/194,739.

Japanese Journal of Applied Physics; vol. 28, No. 7, pp. 1272-1273; 1989; XP009121147.

European Office Action issued on Aug. 11, 2009 in corresponding European Patent Application No. 08 157 16.1.

Final Office Action of U.S. Appl. No. 12/194,730 issued on May 4, 2011.

Final Office Action of U.S. Appl. No. 12/130,340 issued on May 12, 2011.

Non-final Office Action of U.S. Appl. No. 12/409,085 issued on Jun. 24, 2011.

Abstract of KR 2000-41547.

Office Action issued by Korean Intellectual Property Office in Korean Patent Application No. 2007-53314 on Mar. 25, 2008.

Notice of Allowability issued on Sep. 29, 2008 in corresponding Korean Patent Application No. 2007-53314.

Search Report issued by European Patent Office in European Patent Application No. 08157167.1 on Nov. 28, 2008.

European Search Report issued on Dec. 11, 2008 in corresponding European Application No. 08162758.0-1528.

Korean Notice of Allowability issued on Dec. 26, 2008 in corresponding Korean Application No. 2007-84412.

Korean Notice of Allowability issued on Dec. 26, 2008 in corresponding Korean Application No. 2007-84934.

J. L. Benton, Jacobson, D.C., Jackson, B., Johnson, J.A., Boone, T., Eaglesham, D.J., Stevie, F.A., & Becerro, J. "Behavior of Molybdenum in Silicon Evaluated for Integrated Circuit Processing", *Journal of the Electrochemical Society*, 146 (5) (1999), pp. 1929-1933.

S. M. Myers, Seibt, M. & Schröter, W. "Mechanisms of Transition-metal Gettering in Silicon", *Journal of Applied Physics*, V. 88, N. 7 (Oct. 1, 2000), pp. 3795-3819.

Ng, K. K. *Complete Guide to Semiconductor Devices*. Second Edition. Wiley. New York. 2002. pp. 694-695.

Hu, Chen-Ming, et al. "Gettering of Nickel within Ni-Metal Induced Lateral Crystallization Polycrystalline Silicon Film through the Contact Holes". *Japanese Journal of Applied Physics*. Vo. 46, No. 48. 2007. pp. L1188-L1190.

U.S. Appl. No. 12/130,340, filed May 30, 2008, Byoung-Keon Park, Samsung Mobile Display Co. Ltd.

U.S. Appl. No. 12/194,730, filed Aug. 20, 2008, Byoung-Keon Park, Samsung Mobile Display Co. Ltd.

U.S. Appl. No. 12/194,739, filed Aug. 20, 2008, Byoung-Keon Park et al., Samsung Mobile Display Co. Ltd.

U.S. Appl. No. 12/199,232, filed Aug. 27, 2008, Yong-Chan You, Samsung SDI Co., Ltd.

U.S. Appl. No. 12/405,466, filed Mar. 17, 2009, Byoung-Keon Park et al., Samsung Mobile Display Co. Ltd.

U.S. Appl. No. 12/409,085, filed Mar. 23, 2009, Byoung-Keon Park et al., Samsung Mobile Display Co. Ltd.

Non-Final Office Action of U.S. Appl. No. 12/194,739 dated on Jan. 20, 2012.

Non-Final Office Action issued on Sep. 21, 2011 in co-pending U.S. Appl. No. 12/405,466.

Non-Final Office Action issued on Oct. 7, 2011 in co-pending U.S. Appl. No. 12/130,340.

Notice of Allowance issued on Oct. 4, 2011 in co-pending U.S. Appl. No. 12/194,730.

Notice of Allowance issued on Oct. 17, 2011 in co-pending U.S. Appl. No. 12/409,085.

Final Office Action of U.S. Appl. No. 12/130,340 dated Mar. 8, 2012.

Final Office Action of U.S. Appl. No. 12/405,466 dated Apr. 5, 2012.

Notice of Allowance issued for related U.S. Appl. No. 12/194,730 dated Jun. 12, 2012.

Final Office Action of U.S. Appl. No. 12/194,739 dated Jul. 6, 2012.

* cited by examiner

THIN FILM TRANSISTOR, METHOD OF FABRICATING THE SAME, AND ORGANIC LIGHT EMITTING DIODE DISPLAY DEVICE INCLUDING THE THIN FILM TRANSISTOR

CROSS-REFERENCE TO RELATED APPLICATIONS

This application claims the benefit of Korean Patent Application No. 10-2008-0068314, filed Jul. 14, 2008, the disclosure of which is hereby incorporated herein, by reference.

BACKGROUND OF THE INVENTION

1. Field of the Invention

Aspects of the present invention relate to a thin film transistor (TFT), a method of fabricating the same, and an organic light emitting diode (OLED) display device including the TFT.

2. Description of the Related Art

In general, a polycrystalline silicon (poly-Si) layer is widely used as a semiconductor layer for a thin film transistor (TFT), because a poly-Si layer has a high field-effect mobility and may be applied to a high-speed operating circuit, or to a complementary-metal-oxide-semiconductor (CMOS) circuit. A TFT using a poly-Si layer is typically used as an active device of an active-matrix liquid crystal display (AMLCD), or as a switching device or a driving device of an active-matrix organic light emitting diode display device (AMOLED).

The crystallization of an amorphous silicon (a-Si) semiconductor layer may be performed using a solid phase crystallization (SPC) process, an excimer laser annealing (ELA) process, a metal induced crystallization (MIC) process, or a metal induced lateral crystallization (MILC) process. Specifically, the SPC process includes annealing an a-Si layer for several hours, to several tens of hours, at temperatures below 700° C., which is the temperature at which a glass substrate, used in a TFT for a display device, is deformed. The ELA process includes heating an a-Si layer to a high temperature, in a short amount of time, by irradiating the a-Si layer with an excimer laser. The MIC process includes bringing a metal, such as nickel (Ni), palladium (Pd), gold (Au), or aluminum (Al), into contact with an a-Si layer, or injecting the metal into the a-Si layer, to phase change the a-Si layer into a poly-Si layer. Also, the MILC process includes sequentially inducing the crystallization of an a-Si layer, while laterally diffusing a silicide, which is obtained by a reaction between a metal and silicon.

However, since the SPC process involves annealing a substrate at a high temperature, for a long period of time, the substrate can be easily damaged. Also, the ELA process requires an expensive laser apparatus and may damage the crystallized surface, thereby degrading an interface between a semiconductor layer and a gate insulating layer.

A vast amount of research has been conducted on methods of crystallizing an a-Si layer using a metal, because such methods allow an a-Si layer to be crystallized at a lower temperature, for a shorter amount of time, than the SPC method. Typical methods of crystallizing an a-Si layer using a metal include an MIC method, an MILC method, and a super grain silicon (SGS) crystallization method. In these methods, however, the device characteristics of a TFT may be degraded, due to contamination caused by a crystallization-inducing metal. Accordingly, after an a-Si layer is crystallized using the crystallization-inducing metal, a gettering process is performed to remove the remaining crystallization-inducing metal.

A gettering site is formed in a semiconductor layer, in order to perform the gettering process. Conventionally, the formation of the gettering site involves implanting a gettering material into a region of the semiconductor layer, using a contact hole, which is used to connect source and drain regions of the semiconductor layer with source and drain electrodes. However, when a distance between a channel region and the contact hole is increased, a gettering process that uses only the contact hole gettering site is not very effective.

SUMMARY OF THE INVENTION

Aspects of the present invention provide a thin film transistor (TFT) including a semiconductor layer formed of a polycrystalline silicon (poly-Si) layer, which is crystallized using a crystallization-inducing metal. The crystallization-inducing metal can be effectively gettered from a channel region of the semiconductor layer, so as to improve the electrical characteristics thereof, such as leakage current characteristics. A method of fabricating the TFT, and an organic light emitting diode (OLED) display device having the TFT, are also provided.

According to an aspect of the present invention, a TFT includes: a substrate; a semiconductor layer disposed on the substrate, including source, drain, and channel regions; a gate insulating layer disposed on the semiconductor layer; a gate electrode disposed on the gate insulating layer; an interlayer insulating layer disposed on the gate electrode; and source and drain electrodes disposed on the interlayer insulating layer and electrically connected to the source and drain regions of the semiconductor layer. The semiconductor layer is formed of a polycrystalline silicon (poly-Si) layer that is crystallized using a crystallization-inducing metal. The semiconductor layer includes first gettering sites disposed on opposing edges of the semiconductor layer, and a second gettering site spaced apart from the first gettering site.

According to another aspect of the present invention, a method of fabricating a TFT includes: providing a substrate; forming a semiconductor layer, including source, drain, and channel regions, on the substrate, by patterning a poly-Si layer that is crystallized using a crystallization-inducing metal; forming a gate insulating layer on the semiconductor layer; forming a gate electrode on the gate insulating layer; forming an interlayer insulating layer on the gate electrode; forming a first hole and a second hole, by patterning the interlayer insulating layer and the gate insulating layer; forming gettering sites in regions of the semiconductor layer, which are exposed by the first and second holes; gettering the crystallization-inducing metal remaining in the channel region of the semiconductor layer, using the gettering sites; and forming source and drain electrodes that are electrically connected to the source and drain regions of the semiconductor layer, through the first holes. The first holes expose regions of the semiconductor layer, and the second hole is spaced apart from the first holes.

According to yet another aspect of the present invention, an OLED display device includes: a substrate; a semiconductor layer disposed on the substrate and including source, drain, and channel regions; a gate insulating layer disposed on the semiconductor layer; a gate electrode disposed on the gate insulating layer; an interlayer insulating layer disposed on the gate electrode; source and drain electrodes disposed on the interlayer insulating layer and electrically connected to the source and drain regions of the semiconductor layer, respectively; a first electrode electrically connected to one of the source and drain electrodes; an organic layer disposed on the first electrode and including an emission layer (EML); and a second electrode disposed on the organic layer. The semiconductor layer is formed of a poly-Si layer that is crystallized using a crystallization-inducing metal. The semiconductor layer includes first gettering sites disposed on opposing edges of the semiconductor layer, and a second gettering site that is spaced apart from the first gettering sites.

Additional aspects and/or advantages of the invention will be set forth in part in the description which follows and, in part, will be obvious from the description, or may be learned by practice of the invention

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EXEMPLARY EMBODIMENTS

Figure 1A:
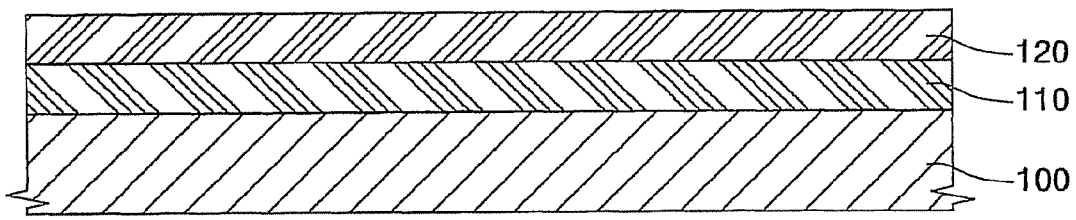
FIGS. 1A through 1D are cross-sectional views illustrating a crystallization process, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

FIGS. 1A through 1D are cross-sectional views illustrating a crystallization process, according to an exemplary embodiment of the present invention. Referring to FIG. 1A, a buffer layer 110 is formed on a substrate 100, such as a glass substrate, or a plastic substrate. The buffer layer 110 may be formed using a chemical vapor deposition (CVD) technique, or a physical vapor deposition (PVD) technique. The buffer layer 110 may be formed of one or more insulating layers, such as a silicon oxide layer or a silicon nitride layer. The buffer layer 110 may prevent the diffusion of moisture or impurities generated in the substrate 100, or may control the transmission heat during a crystallization process, thereby facilitating the crystallization of an amorphous silicon (a-Si) layer.

Thereafter, an a-Si layer 120 is formed on the buffer layer 110. The a-Si layer 120 may be formed using a CVD or a PVD technique. Also, a dehydrogenation process may be performed during or after the formation of the a-Si layer 120, thereby lowering the concentration of hydrogen in the a-Si layer 120.

The a-Si layer 120 is then crystallized into a poly-Si layer. The a-Si layer 120 may be crystallized into the poly-Si layer, by a crystallization method using a crystallization-inducing metal, such as a metal induced crystallization (MIC) method, a metal induced lateral crystallization (MILC) method, or a super grain silicon (SGS) crystallization method.

In the SGS crystallization method, a crystallization-inducing metal is diffused into an a-Si layer, at a low concentration, such that the crystal grain size thereof, ranges from several μm to several hundred μm. For example, the SGS crystallization method may include: forming a capping layer, for controlling the diffusion of a crystallization-inducing metal, on the a-Si layer; forming a crystallization-inducing metal layer on the capping layer; and annealing the crystallization-inducing metal layer, to diffuse a crystallization-inducing metal into the a-Si layer, and thereby crystallize the a-Si layer into a poly-Si layer. Alternatively, the concentration of a crystallization-inducing metal may be lowered, by forming a crystallization-inducing metal layer at a low concentration, without forming a capping layer.

According to the SGS crystallization method using a capping layer, the concentration of a crystallization-inducing metal is controlled more effectively than in the MIC or MILC methods. Thus, the SGS crystallization method will now be described.

Figure 1B:
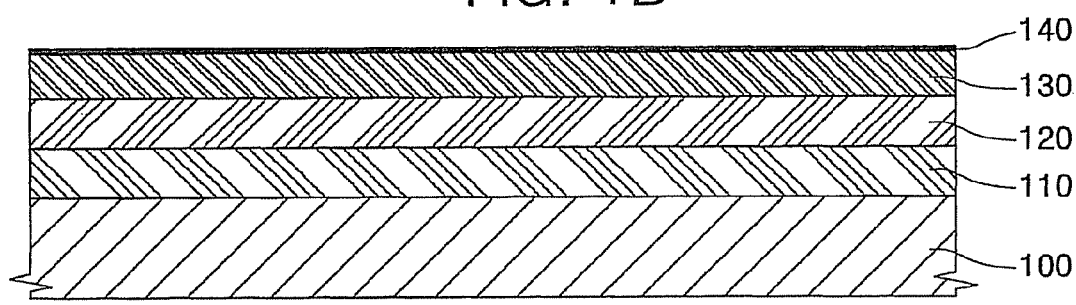

FIG. 1B is a cross-sectional view illustrating a process of forming a capping layer and a crystallization-inducing metal layer on the a-Si layer. Referring to FIG. 1B, a capping layer 130 is formed on the a-Si layer 120. The capping layer 130 may be a silicon nitride layer, into which a crystallization-inducing metal may diffuse during a subsequent annealing process, or capping layer 130 may be a double layer of a silicon nitride layer and a silicon oxide layer.

The capping layer 130 may be formed using a CVD technique or a PVD technique. The capping layer 130 may be formed to a thickness of about 1 to 2000 Å. When the capping layer 130 is formed to a thickness of less than about 1 Å, the capping layer 130 may not properly control the amount of crystallization-inducing metal that diffuses into the a-Si layer 120. When the capping layer 130 is formed to a thickness of more than about 2000 Å, only a small amount of crystallization-inducing metal diffuses into the a-Si layer 120, thereby possibly resulting in an incomplete crystallization of the a-Si layer 120.

Thereafter, a crystallization-inducing metal is deposited on the capping layer 130, thereby forming a crystallization-inducing metal layer 140. The crystallization-inducing metal may include one selected from the group consisting of Ni, Pd, Ag, Au, Al, Sn, Sb, Cu, Tr, and Cd. If the crystallization-inducing metal is Ni, the crystallization-inducing metal layer 140 may be formed with a surface density of about $10^{11}$ to $10^{15}$ atoms/cm$^2$, on the capping layer 130.

When the crystallization-inducing metal layer 140 is formed with a surface density lower than about $10^{11}$ atoms/cm$^2$, only a small number of seeds may be formed, thereby hindering the crystallization of the a-Si layer 120 into a poly- Si layer. When the crystallization-inducing metal layer 140 is formed with a surface density of more than about $10^{15}$ atoms/$cm^2$, the amount of crystallization-inducing metal diffusing into the a-Si layer 120 may be increased, thereby reducing the crystal grain size of the poly-Si layer. Also, the amount of the remaining crystallization-inducing metal may be increased, so that the characteristics of a semiconductor layer, formed by patterning the poly-Si layer, may be degraded.

Figure 1C:
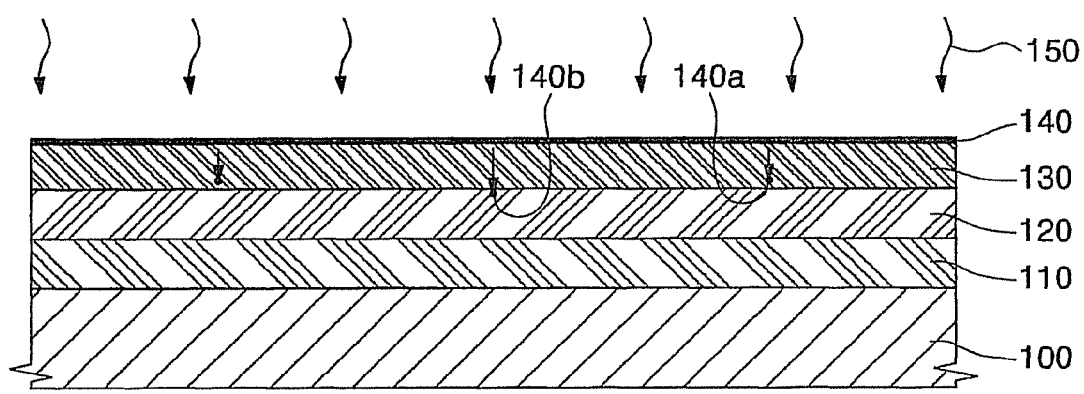

FIG. 1C is a cross-sectional view illustrating a process of annealing the substrate 100, to diffuse the crystallization-inducing metal through the capping layer 130 and into the a-Si layer 120. Referring to FIG. 1C, the substrate 100, including the buffer layer 110, the a-Si layer 120, the capping layer 130, and the crystallization-inducing metal layer 140, is annealed (refer to 150), so that part of the crystallization-inducing metal of the crystallization-inducing metal layer 140 may diffuse into the surface of the a-Si layer 120. Specifically, during the annealing process 150, only a small amount of crystallization-inducing metal 140b is diffused into the surface of the a-Si layer 120, while a large amount of crystallization-inducing metal 140a neither reaches the a-Si layer 120, nor passes through the capping layer 130.

Thus, the amount of crystallization-inducing metal diffused into the surface of the a-Si layer 120 may depend on the diffusion barrier characteristics of the capping layer 120, which are closely related to the thickness and/or density of the capping layer 130. In other words, as the thickness and/or density of the capping layer 130 increases, the diffused amount of crystallization-inducing metal decreases, and the crystal grain size increases. Conversely, as the thickness and/or density of the capping layer 130 decreases, the diffused amount of crystallization-inducing metal increases, and the crystal grain size decreases.

In this case, the annealing process 150 may be performed at a temperature of about 200 to 900° C., for from several seconds to several hours. When the annealing process 150 is performed under the above-described time and temperature conditions, the deformation of the substrate 100, due to overheating, may be prevented, and desired fabrication costs and yields may be achieved. The annealing process 150 may be performed using any one of a furnace process, a rapid thermal annealing (RTA) process, an ultraviolet (UV) process, and a laser process.

Figure 1D:
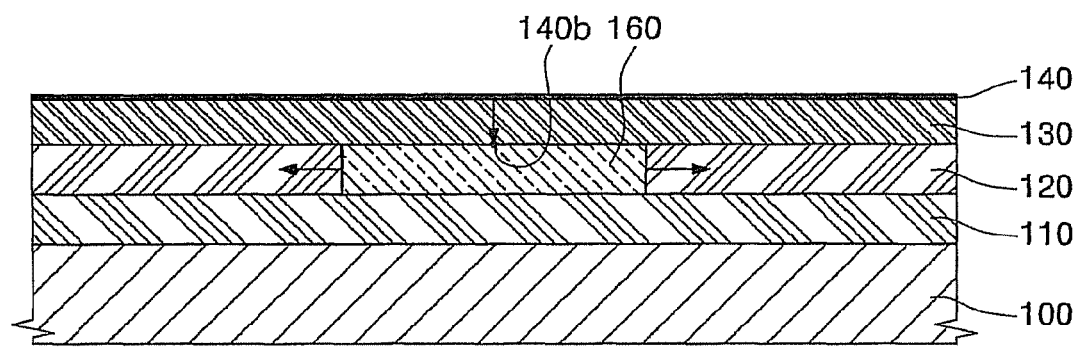

FIG. 1D is a cross-sectional view illustrating a process of crystallizing the a-Si layer 140 into a poly-Si layer 160, using the diffused crystallization-inducing metal 140b. Referring to FIG. 1D, due to the crystallization-inducing metal 140b that passes through the capping layer 130 and diffuses into the surface of the a-Si layer 120, the a-Si layer 120 is crystallized into the poly-Si layer 160. That is, the diffused crystallization-inducing metal 140b combines with the Si of the a-Si layer 120, to form a metal silicide. Thus, the metal silicide forms crystallization nuclei (i.e., seeds), thereby crystallizing the a-Si layer 120 into the poly-Si layer 160.

FIG. 1D illustrates that the annealing process is performed on the structure having the capping layer 130 and the crystallization-inducing metal layer 140. However, after the crystallization-inducing metal is diffused into the surface of the a-Si layer 120, the capping layer 130 and the crystallization-inducing metal layer 140 may be removed, before the annealing process is performed.

Figure 2A:
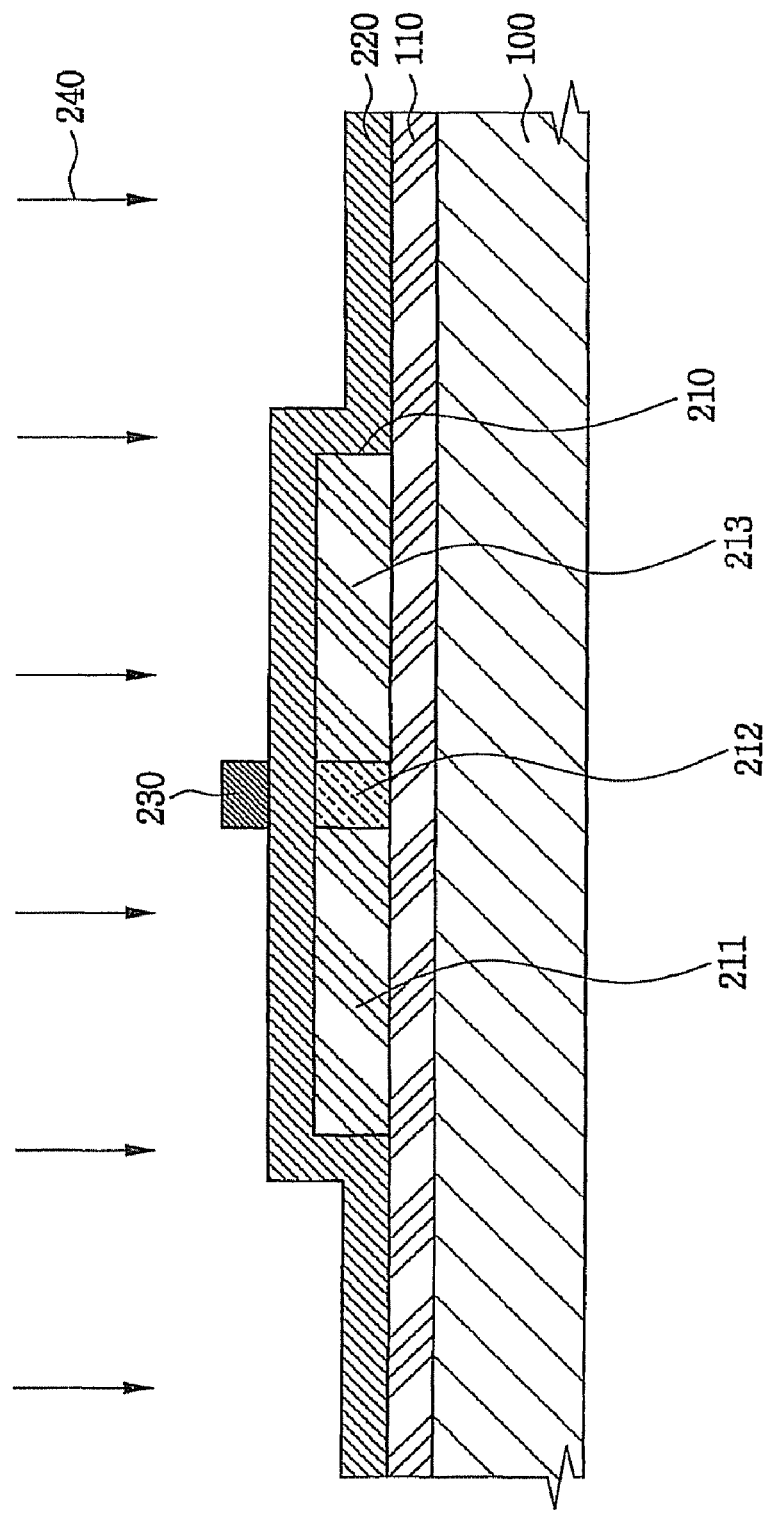
FIGS. 2A, 2B, 2D, and 2E are cross-sectional views illustrating a process of fabricating a thin film transistor (TFT), according to an exemplary embodiment of the present invention.
Figure 2B:
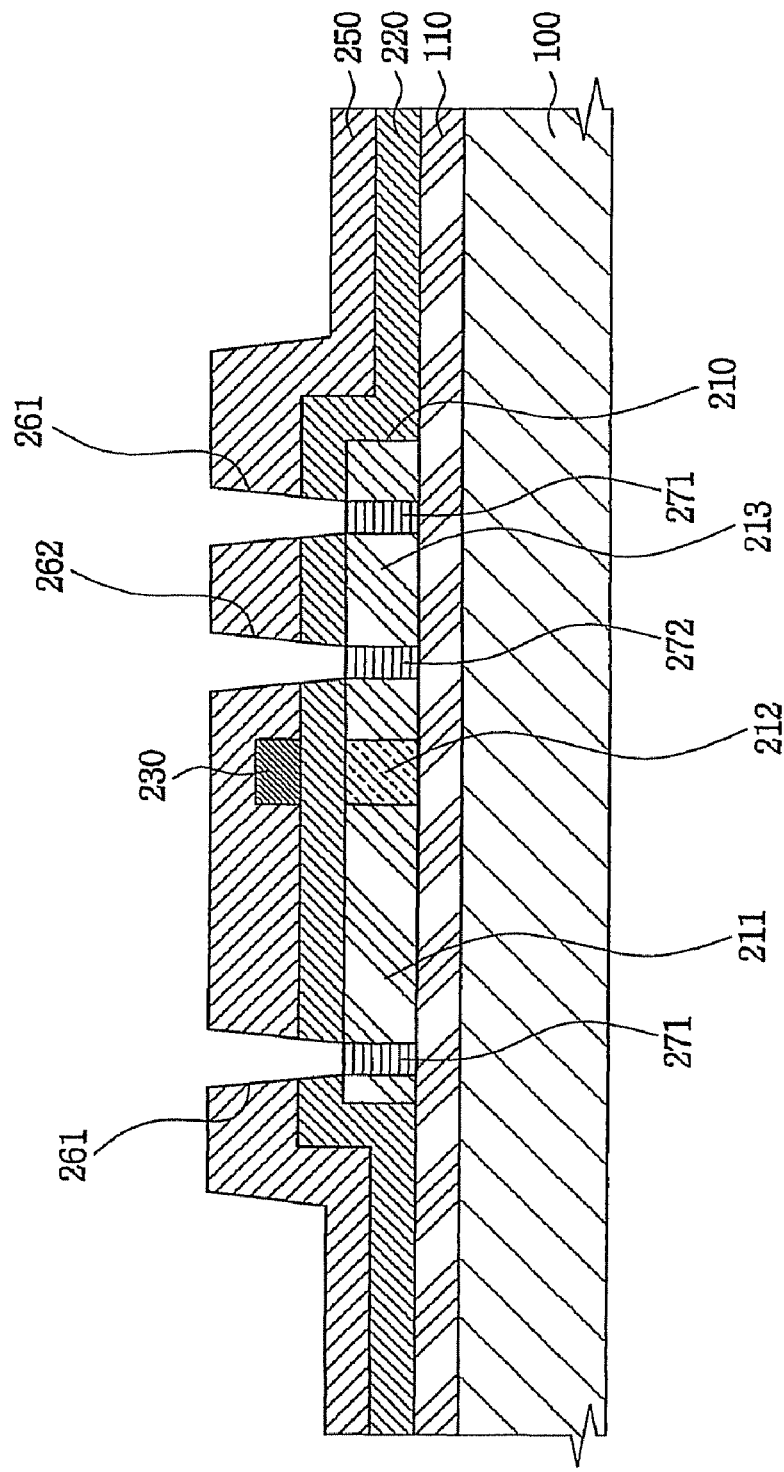
Figure 2C:
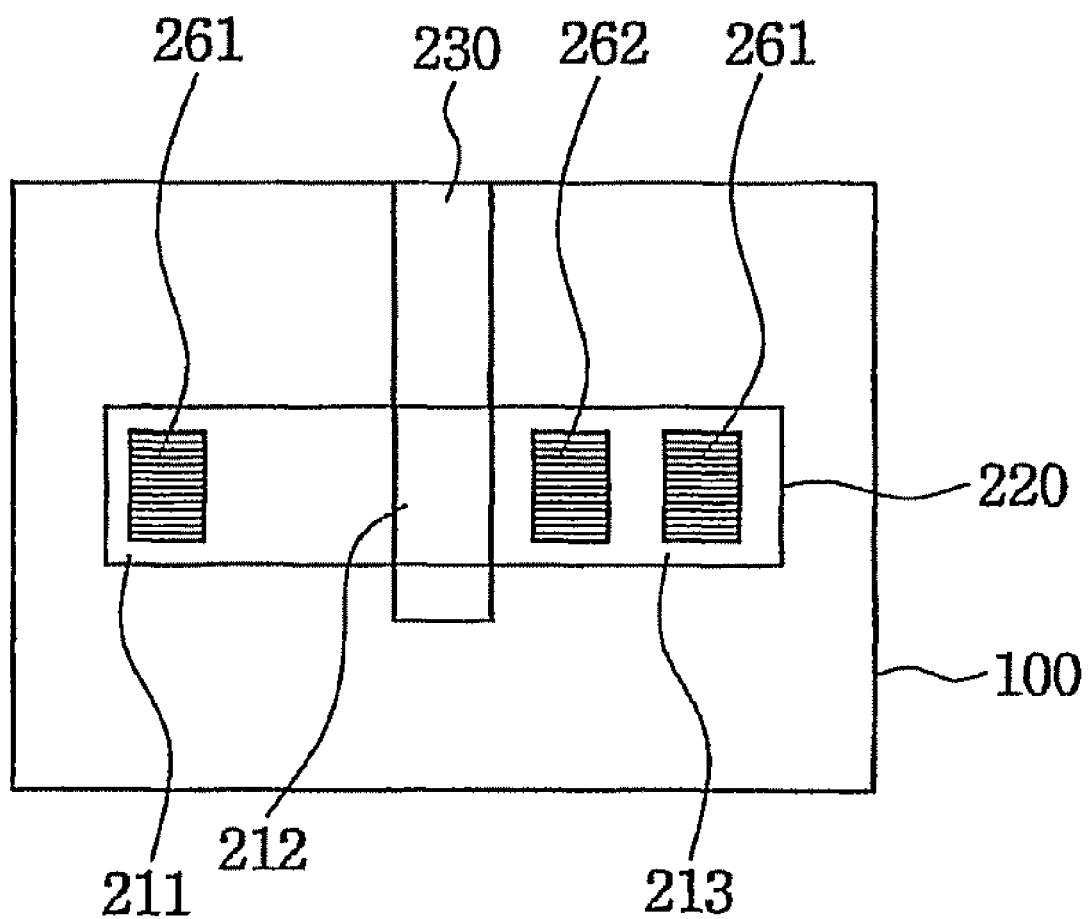
FIG. 2C is a plan view corresponding to the cross-sectional view of FIG. 2B.

FIGS. 2A, 2B, 2D, and 2E are cross-sectional views illustrating a process of fabricating a thin film transistor (TFT), according to an exemplary embodiment of the present invention, and FIG. 2C is a plan view corresponding to the cross-sectional view of FIG. 2B. Referring to FIG. 2A, the capping layer 130 and the crystallization-inducing metal layer 140 are removed, and the poly-Si layer (refer to 160 in FIG. 1D) is patterned, thereby forming a semiconductor layer 210 on the buffer layer 110. The poly-Si layer 160 may alternatively be patterned during a subsequent process.

Thereafter, a gate insulating layer 220 is formed on the semiconductor layer 210 and the buffer layer 110. The gate insulating layer 220 may be a silicon oxide layer, a silicon nitride layer, or a multi-layer thereof.

A metal layer (not shown) for a gate electrode is formed on the gate insulating layer 220. The metal layer may be a single layer formed of aluminum (Al), or an Al alloy, such as an aluminum-neodymium (Al—Nd) alloy, or may include multiple layers formed by stacking an Al alloy layer on a chrome (Cr) layer or a molybdenum (Mo) alloy layer. The metal layer may be etched using photolithography and etching processes, thereby forming a gate electrode 230.

Thereafter, a predetermined amount of conductive ions 240 may be implanted into the semiconductor layer 210, using the gate electrode 230 as a mask, thereby forming source and drain regions 211 and 213, and a channel region 212 disposed therebetween. The conductive ions may be p-type ions or n-type ions. The p-type ions may be ions of one selected from the group consisting of boron (B), aluminum (Al), gallium (Ga), and indium (In). The n-type ions may be ions of one selected from the group consisting of phosphorus (P), arsenic (As), and antimony (Sb). Alternatively, a photoresist pattern may be formed before the gate electrode 230 is formed, and the conductive ions 240 may be implanted into the semiconductor layer 210, using the photoresist pattern as a mask.

Referring to FIGS. 2B and 2C, an interlayer insulating layer 250 is formed on the entire surface of the gate electrode 230. The interlayer insulating layer 250 may be a silicon nitride layer, a silicon oxide layer, or a multi-layer thereof.

Subsequently, regions of the interlayer insulating layer 250 and the gate insulating layer 220 may be etched, thereby forming first holes 261 and a second hole 262. The first holes 261 expose regions of the source and drain regions 211 and 213. The second hole 262 is spaced apart from the first holes 261. For example, the second hole 262 can be formed between the first holes 261. The first holes 261 are contact holes for electrically connecting the source and drain regions 211 and 213 with subsequently formed source and drain electrodes. Thus, the first holes 261 are formed in edges of the semiconductor layer 210, that is, at edges of the source and drain regions 211 and 213. The second hole 262 can improve gettering efficiency.

Thereafter, gettering sites 271 and 272, used for gettering the remaining crystallization-inducing metal from the channel region 212, are formed using the first and second holes 261 and 262, in the regions of the semiconductor layer 210 that are exposed by the first and second holes 261 and 262. The first gettering sites 271 are formed using the first holes 261, while the second gettering site 272 is formed using the second hole 262. Since the crystallization-inducing metal remaining in the channel region 212 is gettered into the first and second gettering sites 271 and 272, the concentration of the crystallization-inducing metal is higher in the first and second gettering sites 271 and 272 than in the channel region 212.

The second gettering site 272 may be disposed in the drain region 213. When the second gettering site 272 is formed in the source region 211, even if a distance from an interface between the source region 211 and the channel region 212, to the second gettering site 272, is increased, a leakage current does not significantly vary. However, when the second gettering site 272 is formed in the drain region 231, as a distance from an interface between the drain region 213 and the channel region 212, to the gettering site 272, is increased, a leakage current gradually increases. Accordingly, since the leakage current is affected by a gettering site disposed in the drain region 213 more than by a gettering site disposed in the source region 211, the second gettering site 272 may be disposed in the drain region 213.

The second gettering site 272 may be disposed within a distance of about 0.5 to 10 μm from the interface between the channel region 212 and the drain region 213. When the second gettering site 272 is disposed at more than about 0.5 μm from the interface between the channel region 212 and the drain region 213, damage to the gate electrode 230 may be prevented during the formation of the second hole 262. When the second gettering site 272 is disposed less than about 10 μm from the interface between the channel region 212 and the drain region 213, gettering efficiency can be further enhanced. At least two of the second gettering sites 272 may be formed, in order to increase gettering efficiency.

The formation of the first and second gettering sites 271 and 272 may be performed using: a method of implanting impurities for gettering into the semiconductor layer 210, using the first and second holes 261 and 262; a method of forming a lattice damage region using a plasma; or a method of forming a metallic layer, including a metallic material other than the crystallization-inducing metal. Since the method of forming the metallic layer material exhibits a high gettering efficiency, it will now be described.

Figure 2D:
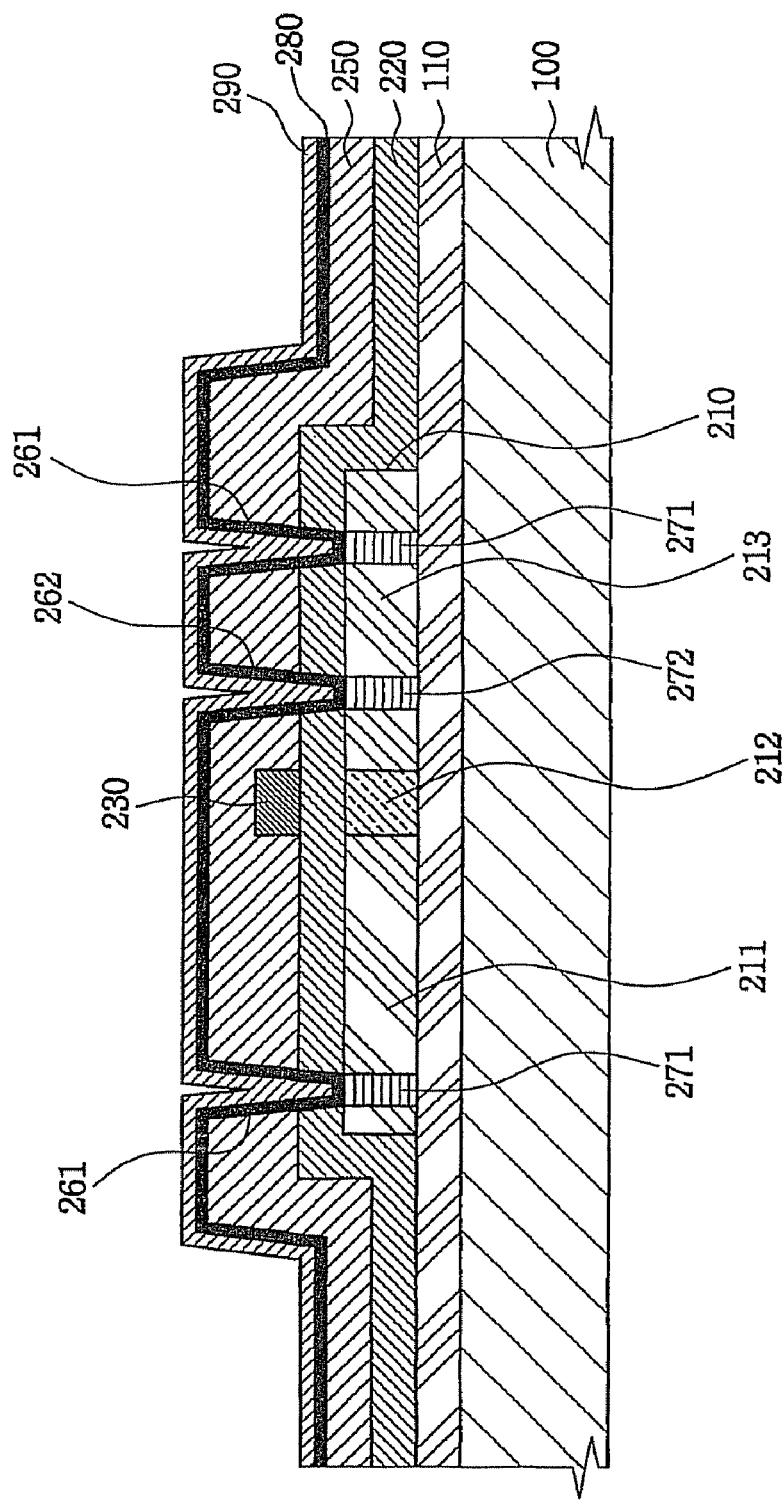

Referring to FIG. 2D, a metallic layer 280 is formed on the interlayer insulating layer 250 having the first and second holes 261 and 262. The metallic layer 280 can be a metal layer, a metal silicide layer, or a multi-layer thereof. The metal layer and the metal silicide layer may be formed using a metal having a lower diffusion coefficient than the crystallization-inducing metal in the semiconductor layer 210, an alloy of the metal. The diffusion coefficient of the metallic layer 280, or components thereof, may be $\frac{1}{100}$, or less, of that of the diffusion coefficient of the crystallization-inducing metal in the semiconductor layer 210. When the diffusion coefficient of the metallic layer 280 is less than about $\frac{1}{100}$ of that of the crystallization-inducing metal, the metal or metal silicide may be prevented from departing from the gettering sites 271 and 272, which contact the metallic layer 280, and may be prevented from diffusing into other regions of the semiconductor layer 210.

Nickel (Ni) is widely used as a crystallization-inducing metal in a semiconductor layer. Since Ni has a diffusion coefficient of about $10^{-5}$ cm$^2$/s, or less, in a semiconductor layer, the metallic layer 280 may be formed of a metal or metal silicide having a diffusion coefficient that is less than about $\frac{1}{100}$ of the diffusion coefficient of Ni, when Ni is used in the semiconductor layer 210. For example, the metallic layer 280, or components thereof, can have a diffusion coefficient between 0 and 10−7 cm$^2$/s. The metallic layer 280 may include one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, an alloy thereof, and a metal silicide thereof.

Also, the metallic layer 280 may be formed to a thickness of about 30 to 2000 Å. When the metallic layer 280 is formed to a thickness of less than about 30 Å, the crystallization-inducing metal may not be effectively gettered into the gettering sites 271 and 272. When the metallic layer 280 is formed to a thickness of more than about 2000 Å, the substrate 200 may be deformed, due to the thermal expansion of the metallic layer 280.

Thereafter, a thermal oxidation barrier layer 290 may be formed on the metallic layer 280. The thermal oxidation barrier layer 290 may prevent the oxidation of the metallic layer 280, and/or the reaction of the metallic layer 280 with a gas, such nitrogen, during a subsequent annealing process, thereby inhibiting the transformation of the surface of the metallic layer 280. The thermal oxidation barrier layer 290 may be a silicon oxide layer or a silicon nitride layer. The thermal oxidation barrier layer 290 may be omitted, when the annealing process is carried out in an inert atmosphere.

The annealing process is performed, in order to remove (getter) the crystallization-inducing metal remaining in the semiconductor layer 210, specifically, from the channel region 212 of the semiconductor layer 210. Thus, a metal of the metallic layer 280 may diffuse into the semiconductor layer 210 and/or combine with the Si of the semiconductor layer 210, to form a metal silicide. Alternatively, a metal silicide of the metallic layer 280 may diffuse into the semiconductor layer 210. As a result, the metal and/or metal silicide is diffused into the surface of the semiconductor layer 210 to a predetermined depth, in the gettering sites 271 and 272. The metal and/or metal silicide may be diffused into the surface of the semiconductor layer 210, to a depth of about 2 to 400 Å, although the depth of the region may be varied, according to an annealing temperature and an annealing time.

When the crystallization-inducing metal diffuses from the channel region 212 of the semiconductor layer 210, into the gettering sites 271 and 272, due to the annealing process, the crystallization-inducing metal precipitates in the gettering sites 271 and 272, and is trapped. This is because the crystallization-inducing metal is thermodynamically more stable in the gettering sites 271 and 272, which contain the metal and/or metal silicide, than in the semiconductor layer 210. Based on the above-described principle, the crystallization-inducing metal can be removed from the channel region 212.

The annealing process may be performed at a temperature of from about 500 to 993° C., for from 10 seconds to 10 hours. When the annealing process is performed at a temperature of lower than 500° C., the crystallization-inducing metal may not diffuse in the semiconductor layer 210 and may not move to the gettering sites 271 and 272. Also, the annealing process may be performed at a temperature of less than about 993° C., because the eutectic point of Ni (the crystallization-inducing metal in the semiconductor layer 210) is 993° C.

When the annealing process is performed for less than 10 seconds, it may be difficult to sufficiently remove the crystallization-inducing metal from the channel region 212. When the annealing process is performed for longer than 10 hours, the substrate 100 may be deformed, and problems may be caused in terms of fabrication costs and yields. When the annealing process is performed at a relatively high temperature, it is possible to remove the crystallization-inducing metal in a relatively short amount of time.

Figure 2E:
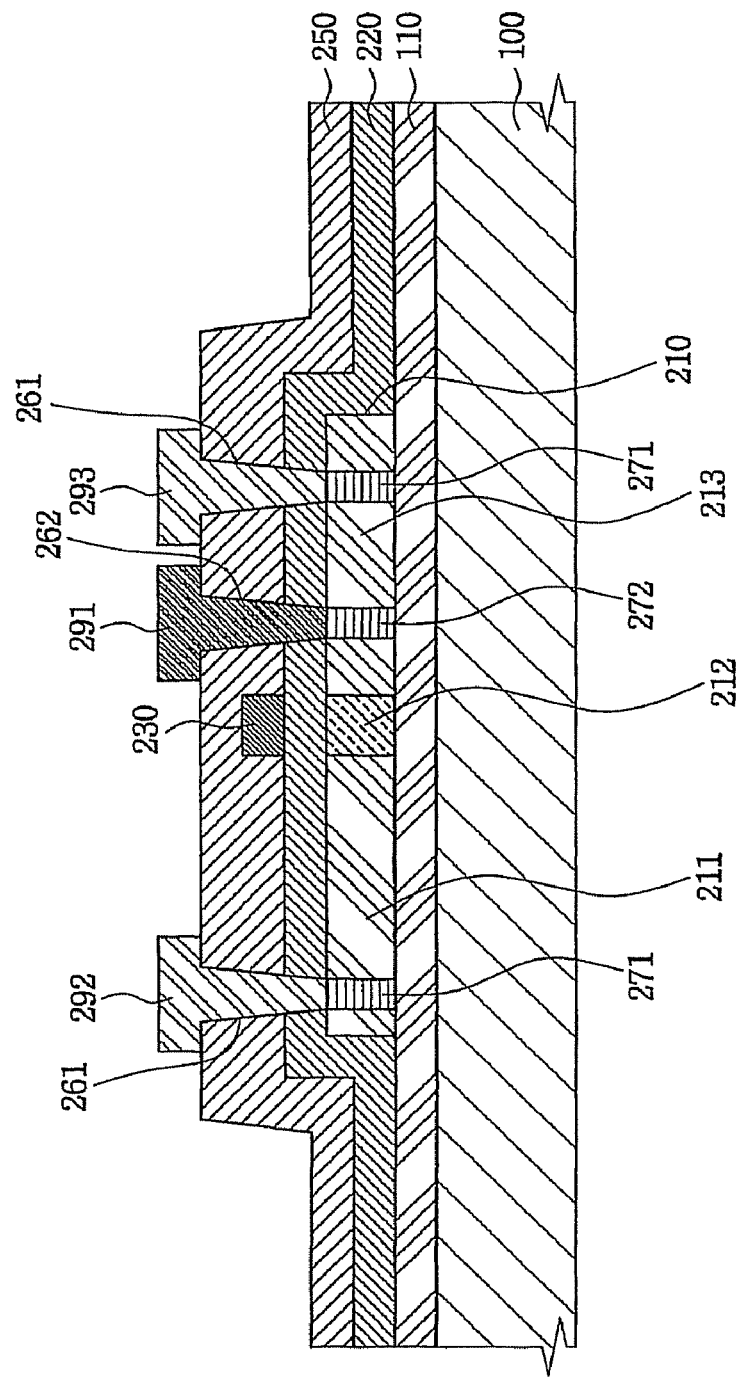

Referring to FIG. 2E, the thermal oxidation barrier layer 290 and the metallic layer 280 are removed. Then source and drain electrodes 292 and 293 are formed. The source and drain electrodes 292 and 293 are connected to the source and drain regions 211 and 213, through the first holes 261. The source and drain electrodes 292 and 293 may be formed of one selected from the group consisting of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

A conductive pattern 291 may optionally be formed in the second hole 262. The conductive pattern 291 may be a resistance reducer. The conductive pattern 291 may be formed by patterning the metallic layer 280. After the source and drain electrodes 292 and 293 and the conductive pattern 291 are formed, a TFT according to the exemplary embodiment of the present invention is completed.

Table 1 shows a comparison of leakage currents of a TFT having a second gettering site (Example 1), according to the exemplary embodiment of the present invention, and a conventional TFT having no second gettering site (Comparative Example 1). In both of the TFTs, a channel region of a semiconductor layer has a width of about 25 μm and a length of about 20 μm. In addition, the distance from an interface of the channel region to a first gettering site is about 50 μm. In Example 1, a distance from the interface of the channel region to the second gettering site is 4 μm.

TABLE 1

|  | Leakage current (A/μm) |
| --- | --- |
| Example 1 | $8.92 * 10^{-13}$ |
| Comparative Example 1 | $3.15 * 10^{-12}$ |

Referring to Table 1, the leakage current of Example 1 was markedly reduced, as compared to Comparative Example 1.

Table 2 shows a comparison of leakage currents of Examples 1-3, according to exemplary embodiments of the present invention, which were TFTs having different numbers of second gettering sites, and a conventional Comparative Example 1, which was a TFT having no second gettering site. In all the TFTs, a channel region of a semiconductor layer had a width of about 25 μm and a length of about 20 μm, and the distance from an interface of the channel regions to a first gettering site was about 50 μm. In Examples 1-3, the distance from the interface of the channel region to the second gettering site was 4 μm.

TABLE 2

|  | Leakage current (A/μm) |
| --- | --- |
| Comparative Example 1 (TFT with no second gettering site) | $3.15 * 10^{-12}$ |
| Example 1 (TFT with 1 second gettering site) | $8.92 * 10^{-13}$ |
| Example 2 (TFT with 2 second gettering sites) | $5.44 * 10^{-13}$ |
| Example 3 (TFT with 3 second gettering sites) | $5.07 * 10^{-13}$ |

Referring to Table 2, it can be confirmed that in Examples 2 and 3, which included at least two second gettering sites, the leakage current was reduced, as compared to Comparative Example 1, which had only one second gettering site.

Table 3 shows a comparison of leakage currents of TFTs, when a distance from an interface between a channel region and a drain region, to a gettering site formed in the drain region, was 4 μm, 10 μm, 30 μm, and 50 μm, respectively. In all the TFTs, the channel regions had a width of about 25 μm and a length of about 20 μm, and the distance from the interface between the channel region and a source region, to a gettering site formed in the source region, was about 4 μm.

Table 4 shows a comparison of leakage currents of TFTs, when a distance from an interface between a channel region and a source region, to a gettering site formed in the source region, was 4 μm, 10 μm, 30 μm, and 50 μm, respectively. In all the TFTs, the channel region had a width of about 25 μm and a length of about 20 μm, the distance from an interface between the channel region and a drain region, to a gettering site formed in the drain region was about 4 μm.

TABLE 3

| Distance from interface between channel region and drain region to gettering site formed in drain region | Leakage current (A/μm) |
| --- | --- |
| 4 μm | $5.47 * 10^{-13}$ |
| 10 μm | $7.60 * 10^{-13}$ |
| 30 μm | $2.33 * 10^{-12}$ |
| 50 μm | $3.06 * 10^{-12}$ |

TABLE 4

| Distance from interface between channel region and source region to gettering site formed in source region | Leakage current (A/μm) |
| --- | --- |
| 4 μm | $5.47 * 10^{-13}$ |
| 10 μm | $5.33 * 10^{-13}$ |
| 30 μm | $5.80 * 10^{-13}$ |
| 50 μm | $6.20 * 10^{-13}$ |

Referring to Tables 3 and 4, even when the distance from the interface between the channel region and the source region, to the gettering site formed in the source region, was increased, the leakage current did not significantly vary. On the other hand, when the distance from the interface between the channel region and the drain region, to the gettering site formed in the drain region, was increased, the leakage current also increased. Accordingly, since the leakage current was more affected by the gettering site formed in the drain region, than by the gettering site formed in the source region, an additional second gettering site may be formed in the drain region.

Table 5 shows a comparison of leakage currents of TFTs, when a distance from an interface of a channel region, to each of gettering sites formed in source and drain regions was 4 μm, 10 μm, 30 μm, and 50 μm, respectively. In all the TFTs, the channel region had a width of about 25 μm and a length of about 20 μm.

TABLE 5

| Distance from interface of channel region to each of gettering sites formed in source and drain regions | Leakage current (A/μm) |
| --- | --- |
| 4 μm | $5.47 * 10^{-13}$ |
| 10 μm | $8.91 * 10^{-13}$ |
| 30 μm | $3.19 * 10^{-12}$ |
| 50 μm | $3.15 * 10^{-12}$ |

Referring to Table 5, when the distance from the interface of the channel region, to each gettering site, was more than 10 μm, a high leakage current of at least $10^{-12}$ A/μm was generated. Therefore, an additional second gettering site may be formed within a distance of about 10 μm from the interface of the channel region.

FIGS. 3A through 3D are plan views illustrating a process of fabricating a dual-gate TFT, according to another exemplary embodiment of the present invention, and FIGS. 4A through 4D are cross-sectional views taken along lines 1A-1A', of FIGS. 3A through 3D, respectively. The process of fabricating the dual-gate TFT will now be described, with reference to the method shown in FIGS. 2A through 2E, except for particulars mentioned below.

Figure 3A:
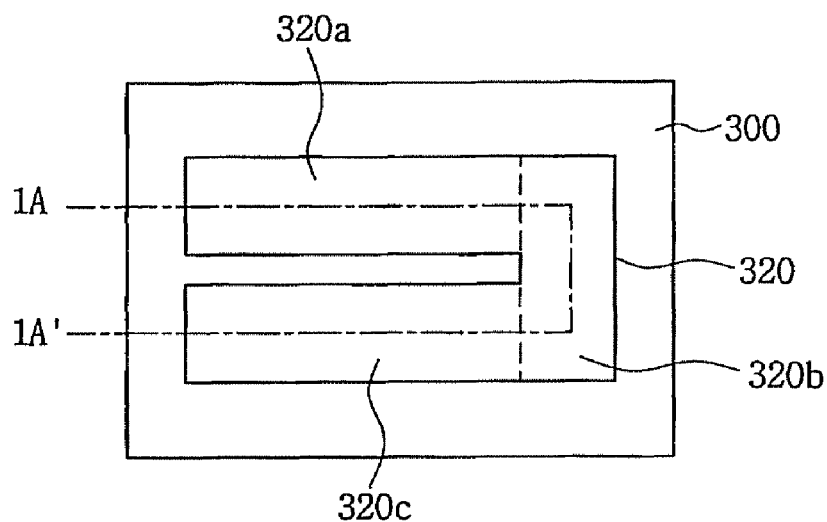
FIGS. 3A through 3D are plan views illustrating a process of fabricating a dual-gate TFT, according to another exemplary embodiment of the present invention.
Figure 4A:
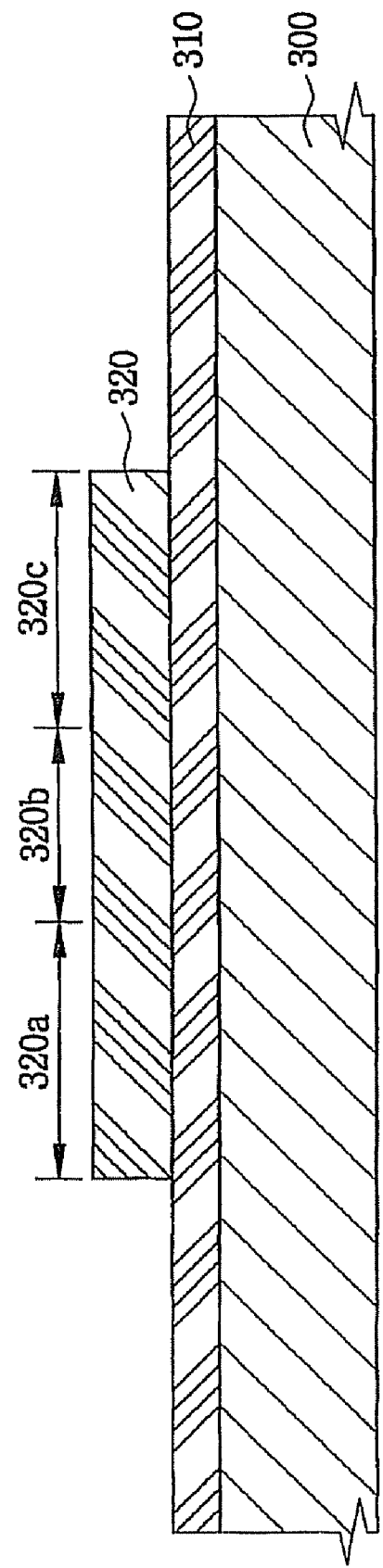
FIGS. 4A through 4D are cross-sectional views illustrating the process of fabricating the dual-gate TFT corresponding to FIGS. 3A through 3D.

Referring to FIGS. 3A and 4A, a poly-Si layer (refer to 160 in FIG. 1D), obtained using an SGS crystallization method as described with reference to FIGS. 1A and 1D, is patterned, thereby forming a semiconductor layer 320 on a substrate 300 having a buffer layer 310. In this case, the semiconductor layer 320 includes body units 320a and 320c, and a connection unit 320b connecting the body units 320a and 320c. The body units 320a and 320c are sides where source regions, drain regions, and/or channel regions are formed. That is, the semiconductor layer 320 may have a "⊏"-shaped structure. Although FIG. 3A illustrates the semiconductor layer 320 with the "⊏"-shaped structure, the present invention is not limited thereto. For example, the semiconductor layer 320 may have a "Ε"-shaped structure, a "彐"-shaped structure, or a combination thereof.

Figure 3B:
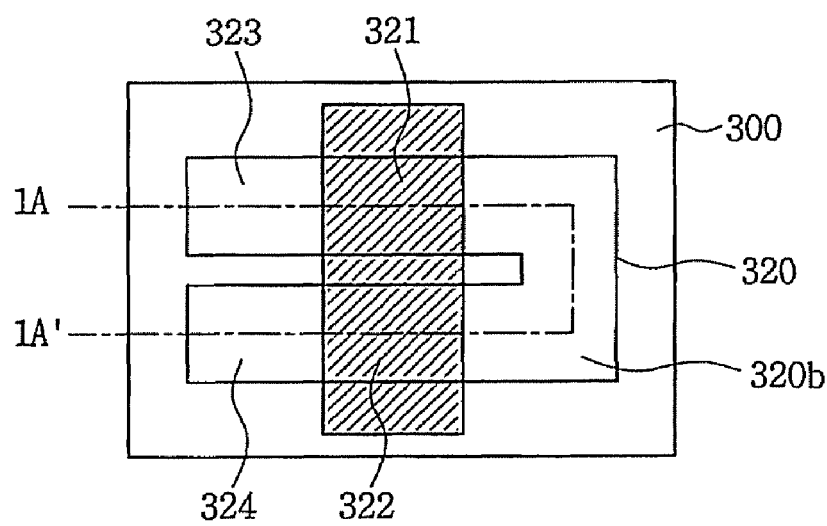
Figure 4B:
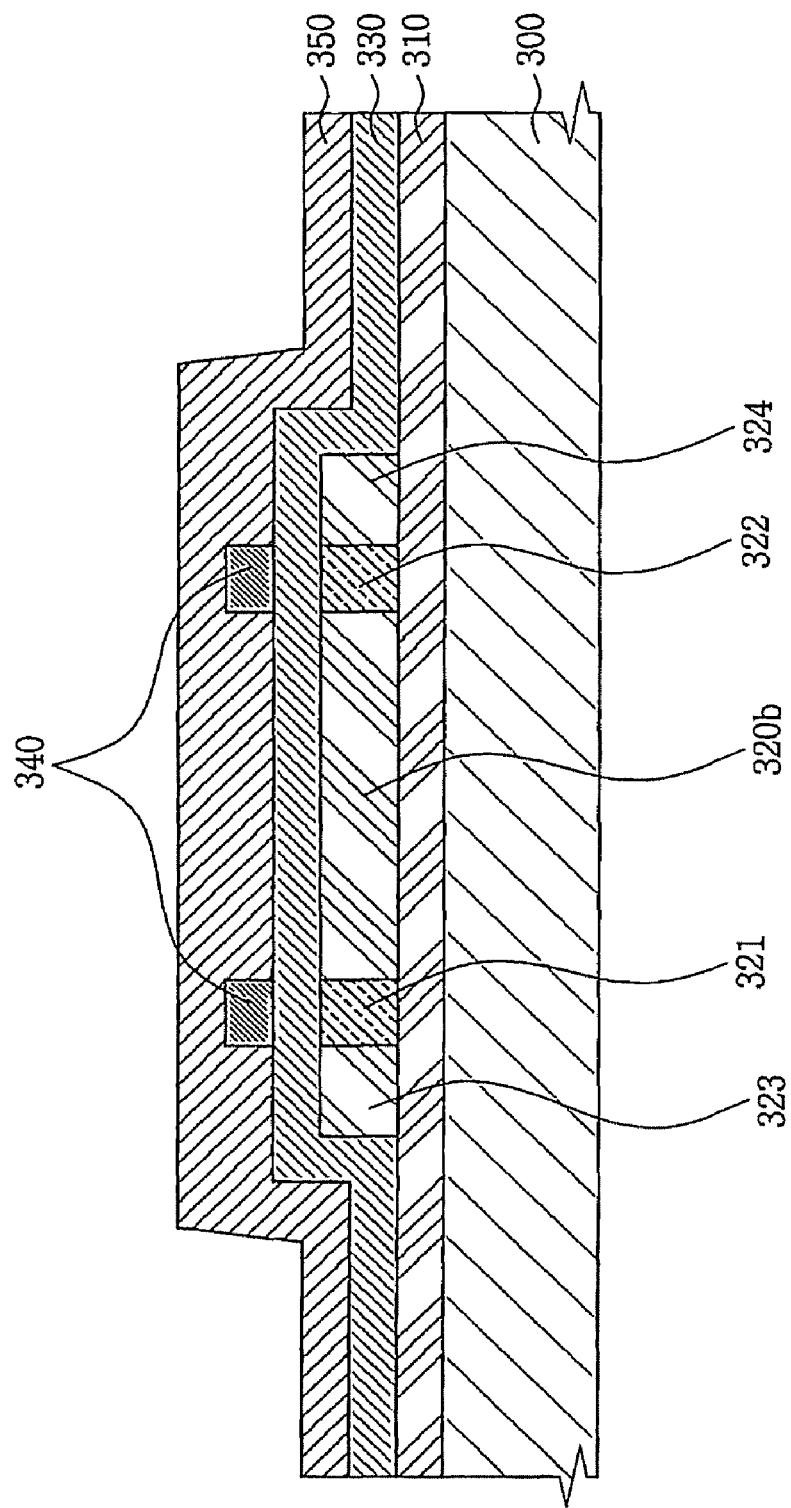

Referring to FIGS. 3B and 4B, a gate insulating layer 330 is formed on the semiconductor layer 320. A gate electrode 340 is formed on the gate insulating layer 330. In this case, the gate electrode 340 may intersect the body units 320a and 320c of the semiconductor layer 320. A portion 321 of the first body unit 320a that overlaps the gate electrode 340 may be referred to as a first gate, and a portion 322 of the second body unit 320c that overlaps the gate electrode 340, may be referred to as a second gate. As a result, a dual gate structure is obtained.

When the semiconductor layer 320 has a plurality of body units with a zigzag structure, instead of the "⊏"-shaped structure, portions of the body units, which overlap the gate electrode 340, can be referred to as gates. Therefore, a multi-gate TFT may be fabricated.

Thereafter, a predetermined amount of conductive ions may be implanted into the semiconductor layer 320, using the gate electrode 340 as a mask. The portions 321 and 322 of the semiconductor layer 320, which overlap the gate electrode 340, can be referred to as channel regions. Outer regions of the body units 320a and 320c, which are not connected to the connection unit 320b, can be referred to as source and drain regions 323 and 324. Subsequently, an interlayer insulating layer 350 is formed on the entire surface of the gate insulating layer 330 and the gate electrode 340.

Figure 3C:
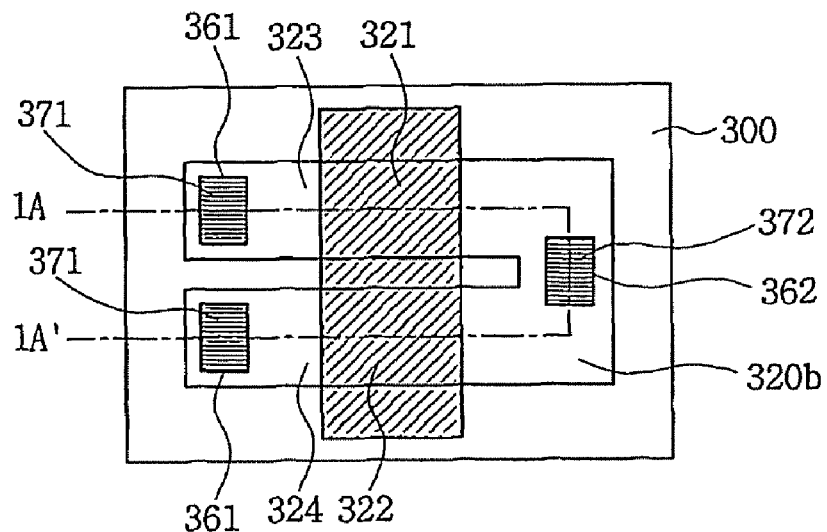
Figure 4C:
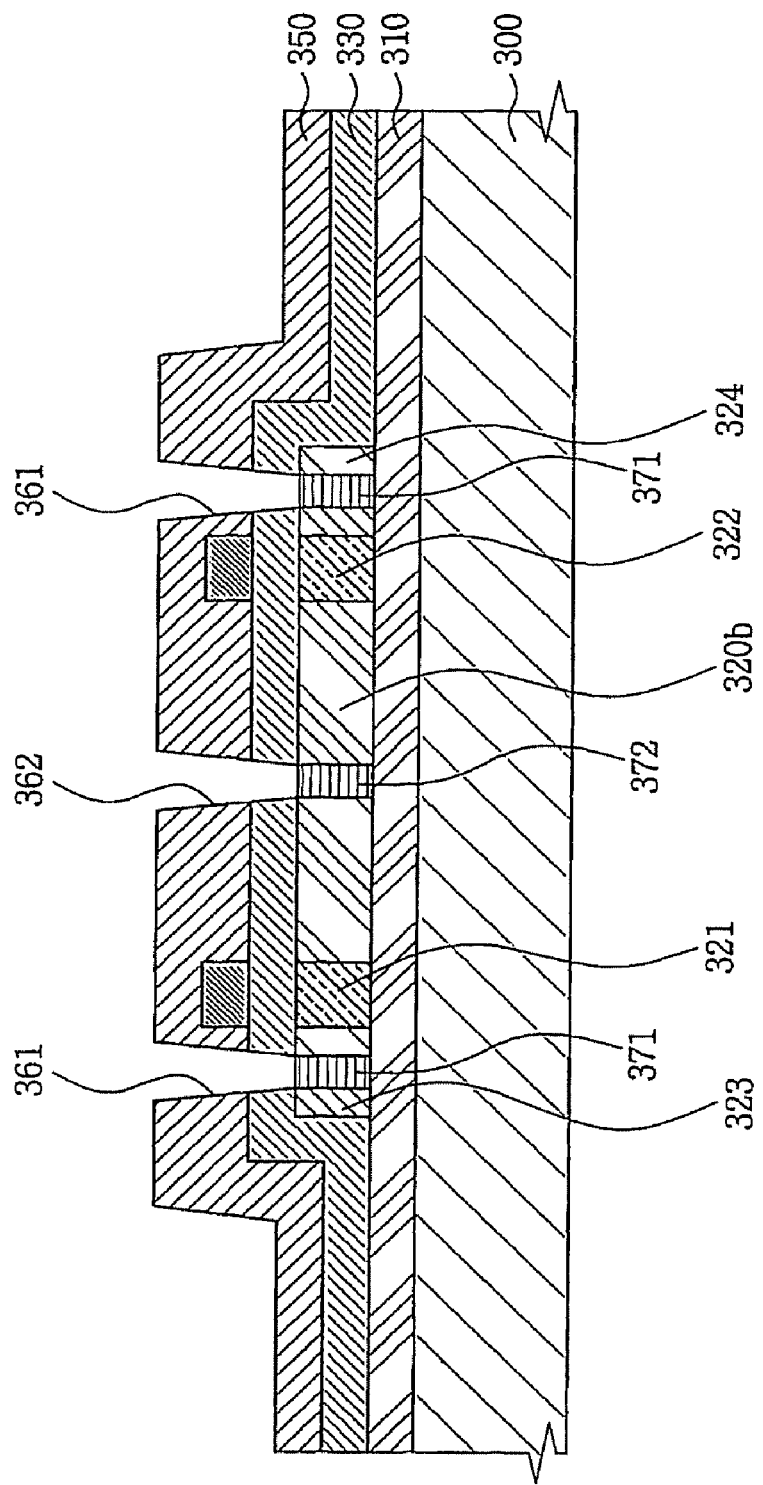

Referring to FIGS. 3C and 4C, the interlayer insulating layer 350 and the gate insulating layer 330 are etched, thereby forming first holes 361 and a second hole 362. The first holes 361 expose portions of the source and drain regions 323 and 324 of the semiconductor layer 320. The second hole 362 is spaced apart from the first holes 361 and partially exposes a region between the channel regions 321 and 322. The first holes 361 are contact holes for electrically connecting the source and drain regions 323 and 324 with, subsequently formed source and drain electrodes. The second hole 362 is formed to increase gettering efficiency.

Thereafter, first gettering sites 371 and a second gettering site 372, for gettering the remaining crystallization-inducing metal from the channel regions 321 and 322, are formed in predetermined regions of the semiconductor layer 320 that are exposed by the first and second holes 361 and 362. The first gettering sites 371 are formed using the first holes 361, and the second gettering site 372 is formed using the second hole 362.

The second gettering site 372 may be disposed closer to the drain region 324 than to the source region 323. When the second gettering site 372 is disposed close to the source region 323, even if a distance from interfaces of the channel region 321 and 322, to the second gettering site 372, is increased, a leakage current does not significantly vary. However, when the second gettering site 372 is formed close to the drain region 324, as a distance from the interfaces of the channel regions 321 and 322, to the second gettering site 372, is increased, a leakage current gradually increases. Accordingly, since the leakage current is affected by a gettering site disposed close to the drain region 324, the second gettering site 372 may be disposed closer to the drain region 324 than to the source region 323.

The second gettering site 372 may be disposed from about 0.5 to 10 μm from the interfaces of the channel regions 321 and 322. When the second gettering site 372 is more than about 0.5 μm from the interfaces of the channel regions 321 and 322, damage to the gate electrode 340 may be prevented, during the formation of the second hole 362. When the second gettering site 372 is disposed at less than about 10 μm from the interfaces of the channel regions 321 and 322, the gettering efficiency can be enhanced. At least two second gettering sites 372 may be formed, in order to further enhance the gettering efficiency.

The first and second gettering sites 371 and 372 may be formed using: a method of implanting impurities into the semiconductor layer 320, using the first and second holes 361 and 362; a method of using plasma to form a lattice damage region; or a method of forming a region containing a metal other than the crystallization-inducing metal or a silicide of the metal. Thereafter, an annealing process may be performed, to getter the crystallization-inducing metal from the channel regions 321 and 322, into the first and second gettering sites 371 and 372.

Figure 3D:
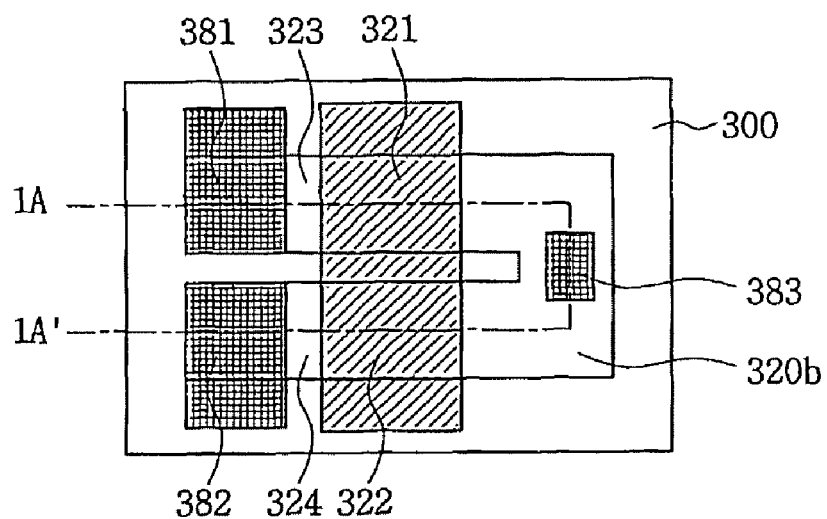
Figure 4D:
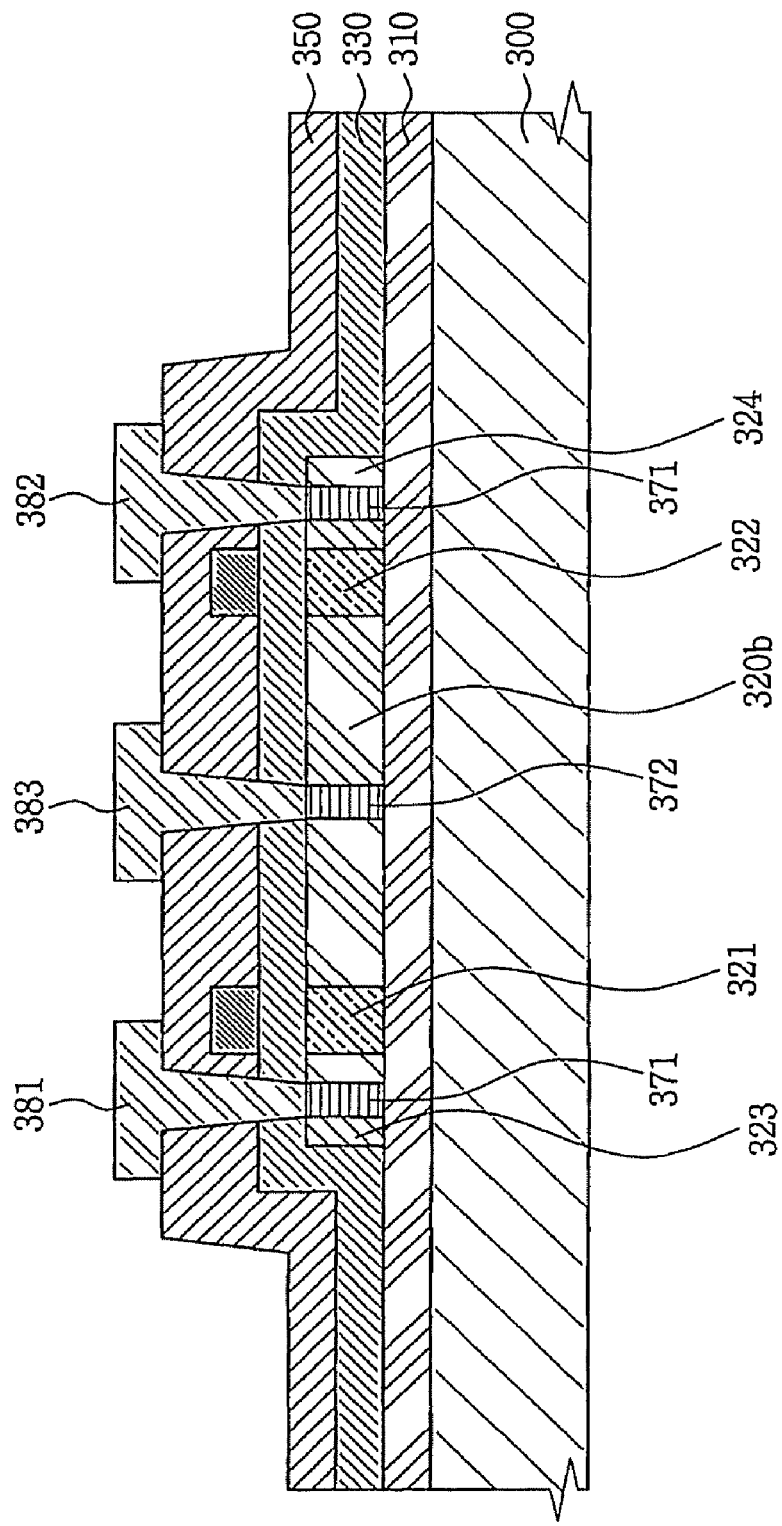

Referring to FIGS. 3D and 4D, source and drain electrodes 381 and 382 are connected to the source and drain regions 323 and 324 through the first holes 361. During the formation of the source and drain electrodes 381 and 382, a conductive pattern 383 may be formed, which is connected to the semiconductor layer 320, through the second hole 362. The conductive pattern 383 may be referred to as a resistance reducer.

Table 6 shows a comparison of leakage currents of a dual-gate TFT having one second gettering site (Example 4), according to the present exemplary embodiment, and a conventional dual-gate TFT having no second gettering site (Comparative Example 4). In both the dual-gate TFTs, a channel region of a semiconductor layer had a width of about 7 μm and a length of about 14 μm. In Example 4, the distance from an interface of the channel region, to the second gettering site, was about 4 μm.

TABLE 6

| | Leakage current (A/μm) |
|---|---|
| Comparative Example 2 (Dual-gate TFT with no second gettering site) | $4.00 * 10^{-13}$ |
| Example 4 (Dual-gate TFT with one second gettering gate) | $2.89 * 10^{-13}$ |

Referring to Table 6, it can be confirmed that Example 4 had a smaller leakage current than Comparative Example 2.

Figure 5:
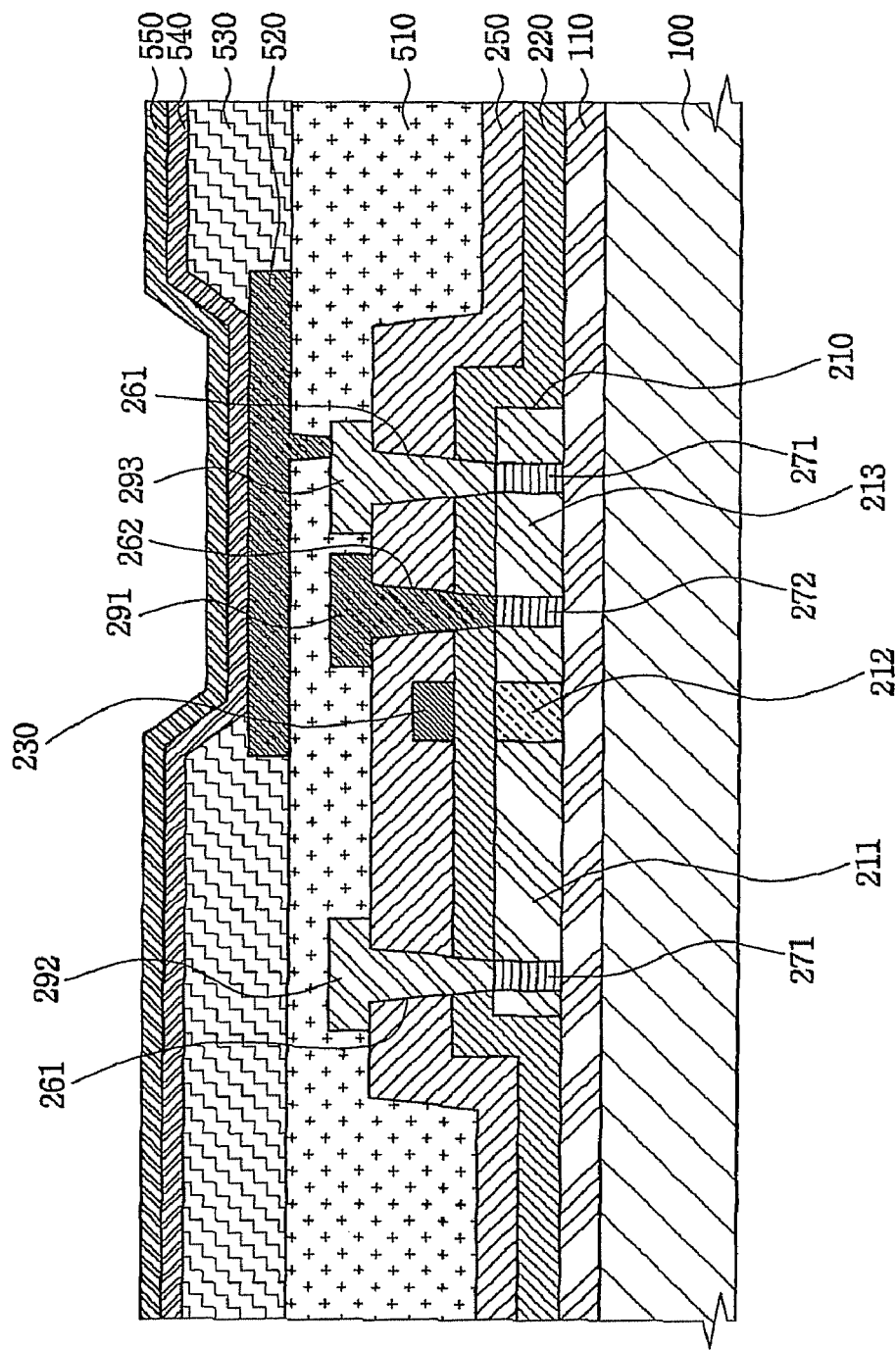
FIG. 5 is a cross-sectional view of an organic light emitting diode (OLED) display device, according to an exemplary embodiment of the present invention.

FIG. 5 is a cross-sectional view of an organic light emitting diode (OLED) display device including a TFT, according to an exemplary embodiment of the present invention. Referring to FIG. 5, an insulating layer 510 is formed on the entire surface of a substrate 100, having the TFT fabricated according to the method described with reference to FIGS. 2A through 2E. The insulating layer 510 may be an inorganic layer, an organic layer, or a multi-layer layer thereof. The inorganic layer may be formed of one selected from the group consisting of silicon oxide, silicon nitride, or silicon on glass (SOG). The organic layer may be formed of one selected from the group consisting of polyimide, a benzocyclobutene series resin, and acrylate.

The insulating layer 510 may be etched, thereby forming a hole exposing the source and drain electrodes 292 and 293. A first electrode 520 is connected to one of the source and drain electrodes 292 and 293, through the hole. The first electrode 520 may be an anode or a cathode. When the first electrode 520 is an anode, it may be formed of a transparent conductive material selected from the group consisting of indium tin oxide (ITO), indium zinc oxide (IZO), and indium tin zinc oxide (ITZO). When the first electrode 520 is a cathode, it may be formed of one selected from the group consisting of Mg, Ca, Al, Ag, Ba, and an alloy thereof.

Subsequently, a pixel defining layer 530 is formed on the first electrode 520. The pixel defining layer 530 has an opening exposing the surface of the first electrode 520. An organic layer 540 having an emission layer (EML) is formed on the exposed surface of the first electrode 520. The organic layer 540 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). After that, a second electrode 550 is formed on the organic layer 540, thereby forming an OLED display device having the TFT, according to the exemplary embodiment of the present invention is completed.

According to aspects of the present invention, in addition to forming a first gettering site, using a first hole connecting source and drain electrodes and source and drain regions of a semiconductor layer, a second gettering site is formed, which is spaced apart from the first gettering site. A crystallization-inducing metal is removed from a channel region of the semiconductor layer, using the first and second gettering sites. As a result, the distance from the channel region to a gettering site can be reduced, thereby increasing the gettering effect. Furthermore, an annealing time for the gettering can be shortened, thereby minimizing damage to a substrate.

The present invention provides a TFT including a semiconductor layer formed using a poly-Si layer, which is crystallized using a crystallization-inducing metal, a method of fabricating the TFT, and an OLED display device having the TFT. In the TFT, the crystallization-inducing metal can be effectively gettered from a channel region of the semiconductor layer, thereby improving leakage current characteristics.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A thin film transistor (TFT) comprising:
a substrate;
a polycrystalline silicon (poly-Si) semiconductor layer disposed on the substrate, comprising:
 a source region,
 a drain region,
 a channel region,
 a crystallization-inducing metal,
 a first gettering site disposed in the drain region and a first gettering site disposed in the source region, and
 a second gettering site spaced apart from the first gettering sites;
a gate insulating layer disposed on the semiconductor layer;
a gate electrode disposed on the gate insulating layer;
an interlayer insulating layer disposed on the gate electrode; and
source and drain electrodes disposed on the interlayer insulating layer and electrically connected to the source and drain regions of the semiconductor layer.

2. The TFT according to claim 1, wherein the second gettering site is disposed in the drain region of the semiconductor layer.

3. The TFT according to claim 2, wherein the second gettering site is disposed within about 0.5 to 10 μm of an interface between the channel region and the drain region.

4. The TFT according to claim 1, wherein the semiconductor layer comprises at least two of the second gettering sites.

5. The TFT according to claim 1, wherein the gate insulating layer and the interlayer insulating layer comprise:
first holes exposing the first gettering sites; and
a second hole exposing the second gettering site.

6. The TFT according to claim 5, wherein the source and drain electrodes are respectively connected to the source and drain regions of the semiconductor layer, through the first holes.

7. The TFT according to claim 1, wherein the first and second gettering sites each comprises a lattice damage region or a gettering impurity.

8. The TFT according to claim 1, wherein each of the first and second gettering sites comprises a metallic material having a lower diffusion coefficient than the crystallization-inducing metal, the metallic material being diffused into the surface of the semiconductor layer to a predetermined depth.

9. The TFT according to claim 8, wherein the diffusion coefficient of the metallic material is less than about 1/100 of the diffusion coefficient of the crystallization-inducing metal.

10. The TFT according to claim 9, wherein the metallic material comprises one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, an alloy thereof, and a silicide thereof.

11. The TFT according to claim 1, wherein the semiconductor layer comprises:
a plurality of the source, drain, and channel regions; and
a plurality of the second gettering sites disposed between the channel regions.

12. The TFT according to claim 11, wherein:
the semiconductor layer comprises body units intersecting the gate electrode; and at least one connection portion connecting adjacent first edges of the body units; and
the first gettering sites are disposed on second edges of the body units, which are not connected by the connection unit.

13. The TFT according to claim 11, wherein the second gettering sites are disposed closer to the drain regions than to the source regions.

14. The TFT according to claim 13, wherein the second gettering sites are each disposed within about 0.5 to 10 .mu.m of an interface between one of the channel regions and the one of drain regions.

15. The TFT according to claim 1, wherein the second gettering site is disposed between the first gettering sites.

16. An organic light emitting diode (OLED) display device comprising:
a substrate;
a poly-Si layer semiconductor layer disposed on the substrate, comprising:
 a source region,
 a drain region,
 a channel region,
 a crystallization-inducing metal,
 a first gettering site disposed in the drain region and a first gettering site disposed in the source region, and
 a second gettering site spaced apart from the first gettering sites;

a gate insulating layer disposed on the semiconductor layer;
a gate electrode disposed on the gate insulating layer;
an interlayer insulating layer disposed on the gate electrode;
source and drain electrodes disposed on the interlayer insulating layer and electrically connected to the source and drain regions of the semiconductor layer, respectively;
a first electrode electrically connected to one of the source and drain electrodes;
an organic layer disposed on the first electrode and including an emission layer (EML); and
a second electrode disposed on the organic layer.

17. The OLED display device according to claim 16, wherein the second gettering site is disposed in the drain region of the semiconductor layer.

18. The OLED display device according to claim 17, wherein the second gettering site is disposed within 0.5 to 10 μm of an interface between the channel region and the drain region.

19. The OLED display device according to claim 16, wherein the second gettering site is disposed between the first gettering sites.

20. The TFT according to claim 19, wherein each of the first and second gettering sites is configured to trap the crystallization-inducing metal which diffuses thereinto.

21. The OLED display device according to claim 16, wherein each of the first and second gettering sites comprises a metallic material having a lower diffusion coefficient than the crystallization-inducing metal, the metallic material being diffused into the surface of the semiconductor layer to a predetermined depth.

22. The OLED display device according to claim 21, wherein each of the first and second gettering sites is configured to trap the crystallization-inducing metal which diffuses thereinto.

* * * * *